(12) United States Patent
Sakurabayashi

(10) Patent No.: US 7,400,039 B2
(45) Date of Patent: Jul. 15, 2008

(54) SEMICONDUCTOR DEVICE AND SEMICONDUCTOR PACKAGE

(75) Inventor: Tara Sakurabayashi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/841,014

(22) Filed: Aug. 20, 2007

(65) Prior Publication Data
US 2008/0048318 A1  Feb. 28, 2008

(30) Foreign Application Priority Data
Aug. 23, 2006  (JP) .............................. 2006-226728

(51) Int. Cl.
*H01L 238/48* (2006.01)
(52) U.S. Cl. ................. 257/734; 257/774; 257/502; 257/503
(58) Field of Classification Search ................. 257/459, 257/502, 503, 734, 774
See application file for complete search history.

(56) References Cited
FOREIGN PATENT DOCUMENTS
JP  2001-203271  7/2001

*Primary Examiner*—Evan Pert
*Assistant Examiner*—Tan N Tran
(74) *Attorney, Agent, or Firm*—Young & Thompson

(57) ABSTRACT

For delivering supply power evenly into chip, a semiconductor device includes plural power supply pads 17a and grounding pads 18a, arranged in alternation in X-direction. The device also includes first upper layer power supply wire 17b, extending in X-direction and connected to first ends of the power supply pads 17, a first upper layer grounding wire 18b, extending in X-direction and connected to second end, opposing first end, of the grounding pads 18a in X-direction. A second upper layer power supply wire 17c extending between first upper layer power supply wire 17b and first upper layer grounding wire 18b, from the power supply pad 17a nearly to neighboring grounding pad 18a, and second upper layer grounding wire 18c extending between first upper layer power supply wire 17b and first upper layer grounding wire 18b, from the grounding pad 18a nearly to neighboring power supply pad 17a. The pads or wires 17a, 17b, 17c, 18a, 18b and 18c are formed on the same pad layer.

9 Claims, 10 Drawing Sheets

FIRST EXEMPLARY EMBODIMENT

FIRST EXEMPLARY EMBODIMENT (A-A')  FIRST EXEMPLARY EMBODIMENT

FIG. 4  FIRST EXEMPLARY EMBODIMENT

FIG. 7 (IDEAL)

(B-B')

US 7,400,039 B2

SEMICONDUCTOR DEVICE AND SEMICONDUCTOR PACKAGE

RELATED APPLICATION

This application is based upon and claims the benefit of the priority of Japanese patent application No. 2006-226728, filed on Aug. 23, 2006, the disclosure of which is incorporated herein in its entirety by reference thereto.

FIELD OF THE INVENTION

This invention relates to a semiconductor device and a semiconductor package. More particularly, this invention relates to a semiconductor device and a semiconductor package that supply the power within a chip uniformly and efficiently.

BACKGROUND OF THE INVENTION

In a certain semiconductor device (semiconductor chip), including an on-chip LSI (Large Scale Integrated Circuit), such as a micro-processor, a large number of protuberant electrodes (bumps) are formed on each pad formed on the chip surface. The chip is mounted on a wiring board, with its surface carrying the bumps directing downwards, so that the bumps will be directly connected to land wires on the wiring board, in which the bumps are electrically connected to outside. This semiconductor device is generally termed a flip chip. With the semiconductor device of the flip chip system, to enable unit cells to carry out accurate logic operations, the power supply wiring and the grounding wiring are arranged so as to reduce the voltage drop, in such a manner as to enable the power from the power supply to be delivered uniformly and efficiently within the chip.

A semiconductor device of the related art, supplying the power uniformly and efficiently within the chip, is disclosed in Patent Document 1, and is shown herein in FIGS. 9 and 10. From a power supply electrode 103, provided on the surface of a semiconductor chip 105, power supply wires 107, connected to this power supply electrode 103, are derived and extended in a direction X. From a grounding electrode 104, grounding wires 108, connected to this grounding electrode 104, are derived and extended in the direction X in adjacency to the power supply wire 107. A lower layer power supply wire 110 is formed in a layer below the power supply wires 107 for extending in a direction Y substantially orthogonal to the direction of the power supply wires 107. The lower layer power supply wire 110 is connected to the power supply wires 107. A lower layer grounding wire 113 is formed in a layer below the grounding wires 108 for extending in the direction Y substantially orthogonal to the direction of the grounding wires 108. The lower layer grounding wire 113 is connected to the grounding wires 108 (Patent Document 1, FIGS. 9 and 10).

[Patent Document 1]
  JP Patent Kokai Publication No. JP-P2001-203271A

SUMMARY OF THE DISCLOSURE

The following analysis is given by the present invention. The entire disclosure of the aforementioned Patent Document 1 is herein incorporated by reference thereto.

In the wiring structure of Patent Document 1, through-hole wires (interconnections) (vias) 112, 115 are arranged in a congested state from one row of a width corresponding to a pad width to another. The pad width is the width of a power supply pad 101 or a grounding pad 102 of FIG. 9 in the Y-axis direction. Hence, there is a wide interval L, not smaller than the sum of a pad width and a wire width, between two neighboring through-hole wires, such as between through-hole wires 112 and 112 in FIG. 10. In this constitution, the current from the through-hole wires 112 to the lower layer power supply wire 110 is locally offset, such that, in a region of the lower layer power supply wire 110 where the current is maximal, the supply power load is increased. Such region becomes a neck point 110a (site of current concentration) marked by a broken-lined circle. In this region, a high power supply capability is required due to the maximum current load. If the constitution of the power supply wiring is to be designed to meet this high power supply capability, the lower layer power supply wire 110 in its entirety needs to be of considerable thickness and width. As a result, the thickness and the width of the region of high congestion of the through-hole wires 112, which is not in need of a high power supply capability, become equal to those of the region of lower congestion of the through-hole wires 112 which is in need of the high power supply capability, thus leading to an increased chip size. It is true that the wiring constitution of Patent Document 1 has been proposed at the time when it was not possible to provide for via connection in a region below the pads 101, 102 mounted in turn below the protuberant electrodes. However, even if via connection below the pads 101, 102 is possible, the broad interval that covers a pad width and a wire width still exists between vias in the vicinity of the neck points insofar as the power supply wire 107 below the grounding electrode 104 or the grounding wire 108 below the power supply pad 101 is concerned.

On the other hand, if a power supply wiring constitution is to be designed so that no broad region exists between vias in the vicinity of the neck point 110a, there is fear that a signal wire, not shown, can not be laid in the same wiring layer as that of the lower layer power supply wire 110. If, in an attempt to overcome this disadvantage, a wiring layer for a signal wire, not shown, and the lower layer power supply wire 110 are to be provided separately from one another, the number of the wiring layers is increased. Further, if the wiring resources are of a problem, the chip size may be increased.

It is therefore an object of the present invention to ensure uniform efficient supply of the supply power within the chip as wiring resources are secured.

In a first aspect, the present invention provides a semiconductor device comprising a plurality of pads and a plurality of protuberantly formed electrodes arrayed in regular order on a surface of each pad. The semiconductor device is mounted on a wiring board in accordance with a flipchip system. The semiconductor device comprises a plurality of first potential pads to which a first potential is applied, and a plurality of second potential pads to which a second potential different from the first potential is applied. The second potential pads are formed in the same layer as the first potential pads and are arrayed in one direction in alternation with the first potential pads. The semiconductor device also includes a first potential upper layer common wire formed in the same layer as the first potential pads. The first potential upper layer common wire extends in the aforementioned one direction and is connected to a first end of each of the first potential pads viewed in the aforementioned one direction. The semiconductor device also includes a second potential upper layer common wire formed in the same layer as the second potential pad. The second potential upper layer common wire extends in the aforementioned one direction and is connected to a second end of the second potential pad. The second end is on the opposite side to the first end viewed in the aforementioned one direction. The semiconductor device also includes a first potential upper layer branched wire formed in the same layer as the first potential pad and extending between the first potential upper layer common wire and the second potential upper layer common wire, from the first potential pad to the vicinity of the neighboring second potential pad. The semiconductor device also includes a second potential upper layer branched wire formed in the same layer as the second potential pad and extending between the first potential upper layer common wire and the second potential upper layer common wire, from the second potential pad to the vicinity of the neighboring first potential pad.

In the semiconductor device according to the present invention, the first potential upper layer branched wire is preferably arranged between the second potential upper layer common wire and the second potential upper layer branched wire. The second potential upper layer branched wire is preferably arranged between the first potential upper layer common wire and the first potential upper layer branched wire.

Preferably, the semiconductor device further comprises a first potential lower layer wire, formed in a layer below the first potential pad, the first potential upper layer common wire and the first potential upper layer branched wire. The first potential lower layer wire is connected by way of vias to one or more or all of the first potential pad, the first potential upper layer common wire and the first potential upper layer branched wire. The first potential lower layer wire extends in a direction substantially orthogonal to the first potential upper layer common wire and the first potential upper layer branched wire. Preferably, the semiconductor device further comprises a second potential lower layer wire formed in a layer below the second potential pad, the second potential upper layer common wire and the second potential upper layer branched wire. The second potential lower layer wire is connected by way of vias to one or more or all of the second potential pad, the second potential upper layer common wire and the second potential upper layer branched wire. The second potential lower layer wire extends in a direction substantially orthogonal to the second potential upper layer common wire and the second potential upper layer branched wire.

The first potential upper layer branched wire and the second potential upper layer branched wire may be extended each in a plurality of number from one side of one of the pads; and first potential upper layer branched wires and the second potential upper layer branched wires may be interdigitated.

The first potential lower layer wire may be connected by way of vias to the first potential pad of an n'th row, to the first potential upper layer common wire and the first potential upper layer branched wire of an (n+1)st row, to the first potential upper layer common wire of an (n+2)nd row and to the first potential upper layer common wire and the first potential upper layer branched wire of an (n+3)rd row; and the second potential lower layer wire may be connected by way of vias to the second potential upper layer common wire of an n'th row, to the second potential upper layer common wire and the second potential upper layer branched wire of an (n+1)st row, to the second potential pad of an (n+2)nd row and to the second potential upper layer common wire and the second potential upper layer branched wire of an (n+3)rd row.

The first potential lower layer wire may be connected, in an m'th column, by way of vias, to the first potential pad of an n'th row and to the first potential upper layer common wire and the first potential upper layer branched wire of the (n+1)st row; and the second potential lower layer wire may be connected, in the m'th column, by way of vias, to the second potential upper layer common wire of an n'th row and to the second potential upper layer common wire and the second potential upper layer branched wire of the (n+1)st row.

The first potential lower layer wire may be connected, in the (m+2)nd column, by way of vias, to the first potential upper layer common wire of the n'th row and to the first potential upper layer common wire and the first potential upper layer branched wire of the (n+1)st row; and the second potential lower layer wire may be connected, in the (m+2)nd column, by way of vias, to the second potential pad of the n'th row and to the second potential upper layer common wire and to the second potential upper layer branched wire of the (n+1)st row.

The first potential may be a power supply potential; and the second potential may be a grounding potential.

In a second aspect, the present invention provides a semiconductor package comprising a wiring board and the above semiconductor device mounted via electrodes on the wiring board in accordance with the flipflop system.

The meritorious effects of the present invention are summarized as follows.

According to the present invention, supply power loads to the lower layer may be lighter by the configuration in which, as it is attempted to keep the optimum vias distribution, the via-to-via distance in a neck point is reduced on the whole to a smaller value than in the related art device. This achieves a smaller number of wiring layers and a smaller chip size while positively assuring the wiring resources.

BRIEF DESCRIPTIONS OF THE DRAWINGS

PREFERRED MODES OF THE INVENTION

First Exemplary Embodiment

Figure 1:
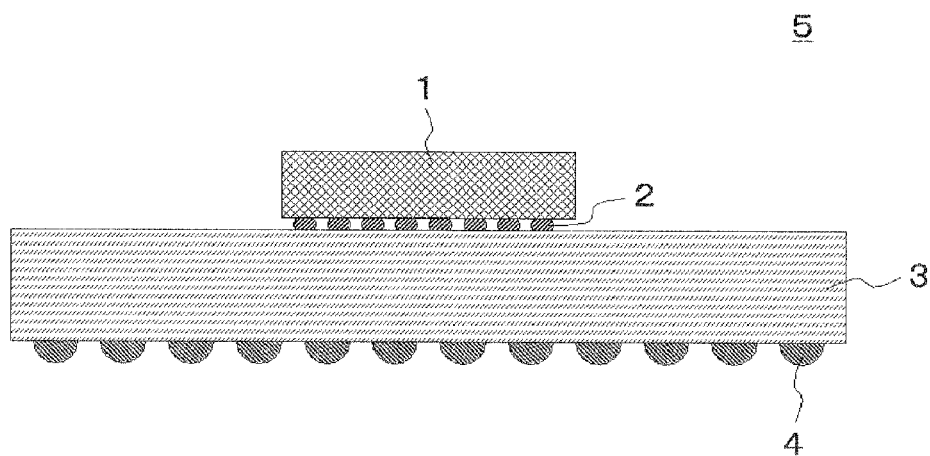
FIG. 1 is a partial cross-sectional view schematically showing the constitution of a semiconductor package having mounted thereon a semiconductor device according to a first exemplary embodiment of the present invention.
Figure 2:
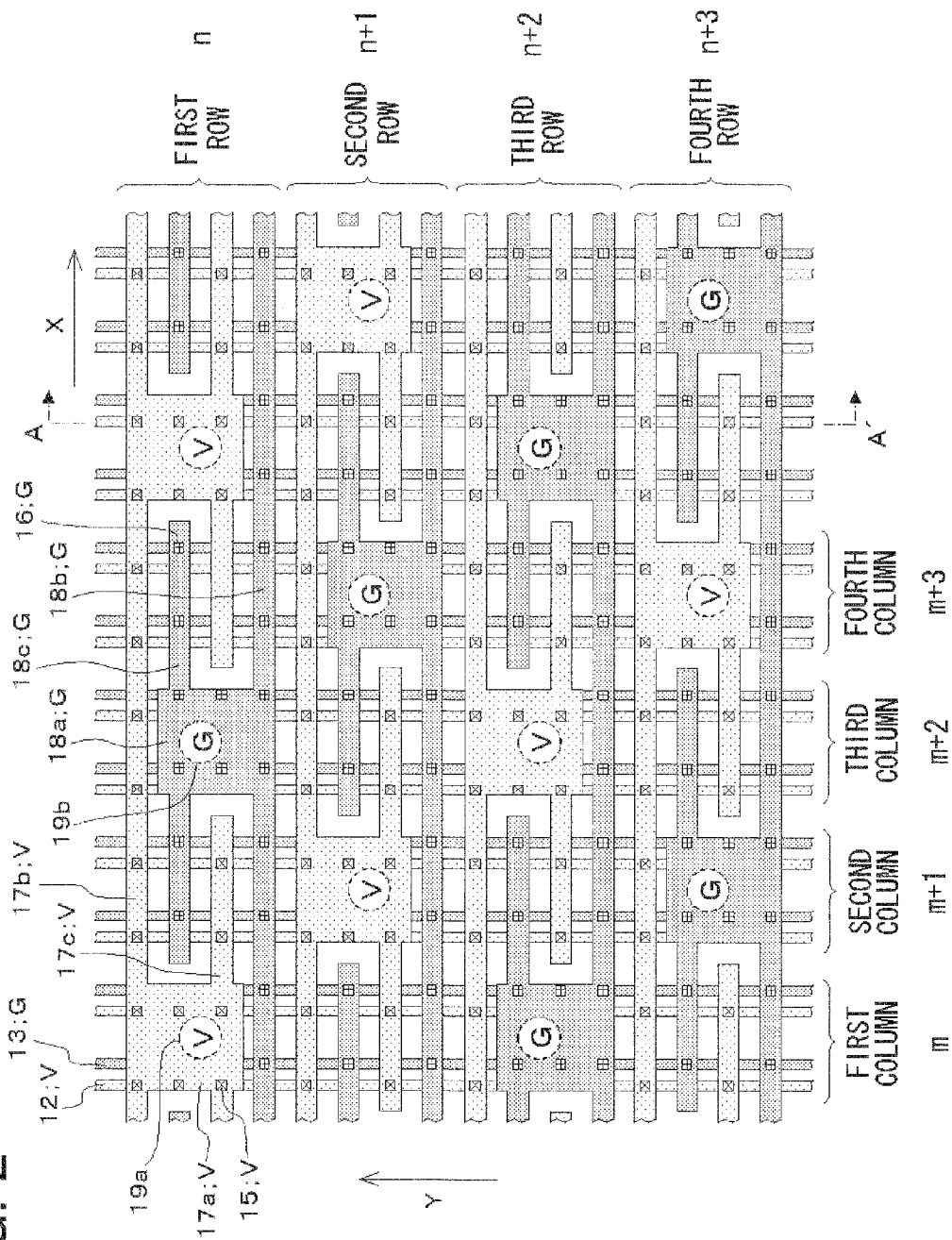
FIG. 2 is a partial plan view schematically showing the wiring constitution of the semiconductor device according to the first exemplary embodiment of the present invention.
Figure 3:
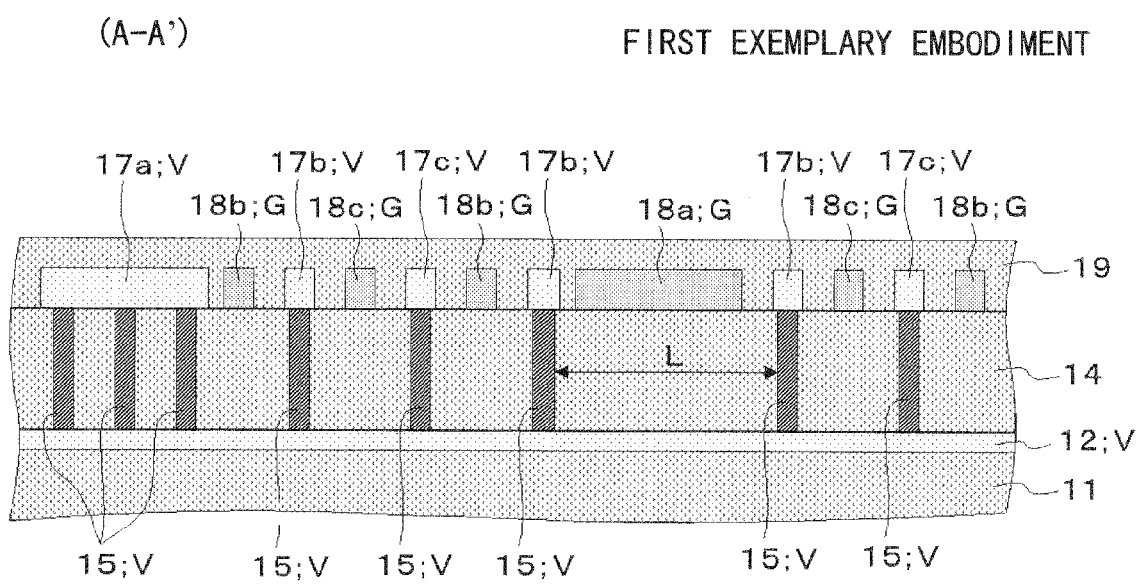
FIG. 3 is a partial cross-sectional view, taken along line A-A' of FIG. 2, and schematically showing the wiring constitution of the semiconductor device according to the first exemplary embodiment of the present invention.
Figure 4:
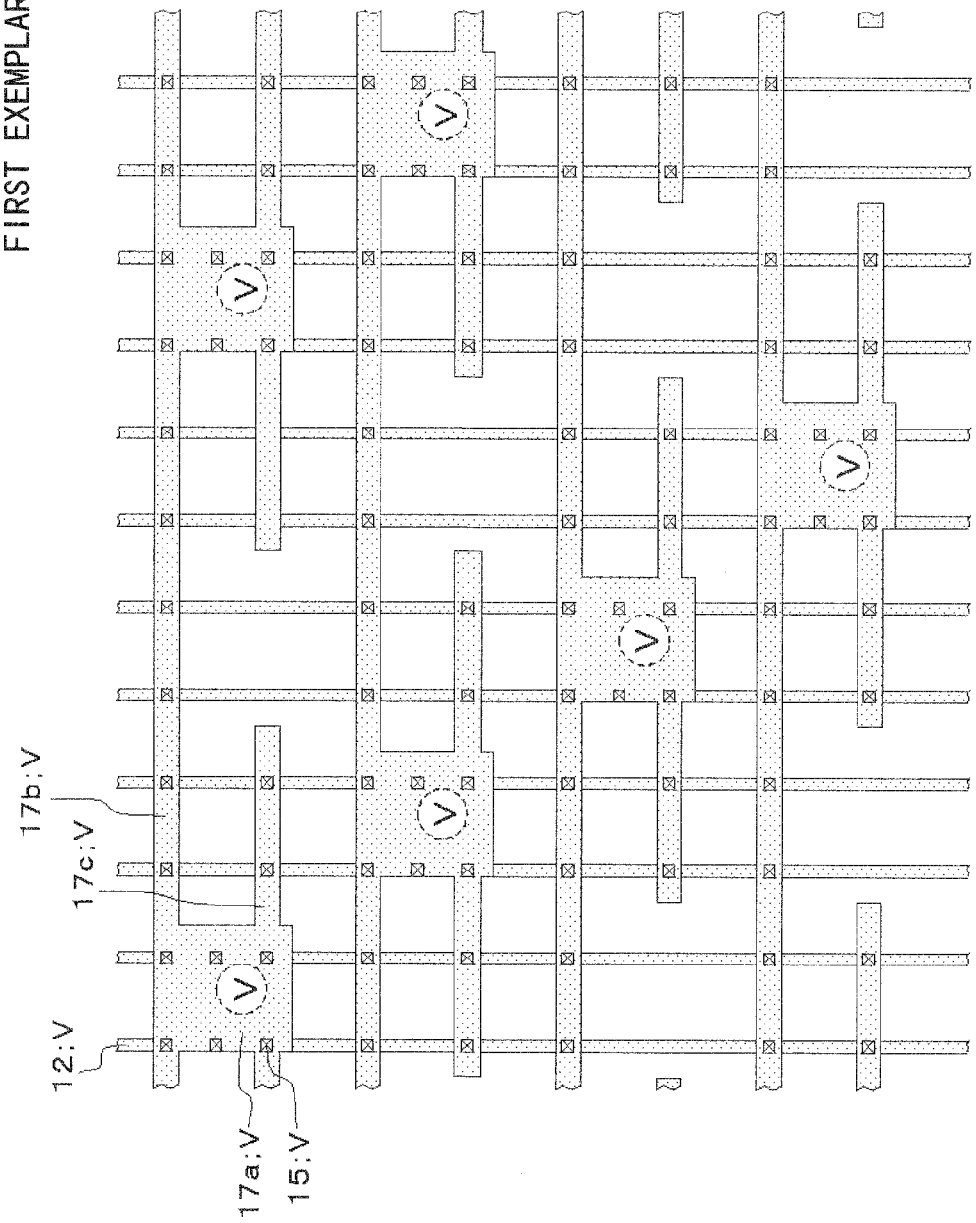
FIG. 4 is a schematic partial plan view schematically showing only the power supply wiring constitution of the semiconductor device according to the first exemplary embodiment of the present invention.
Figure 5:
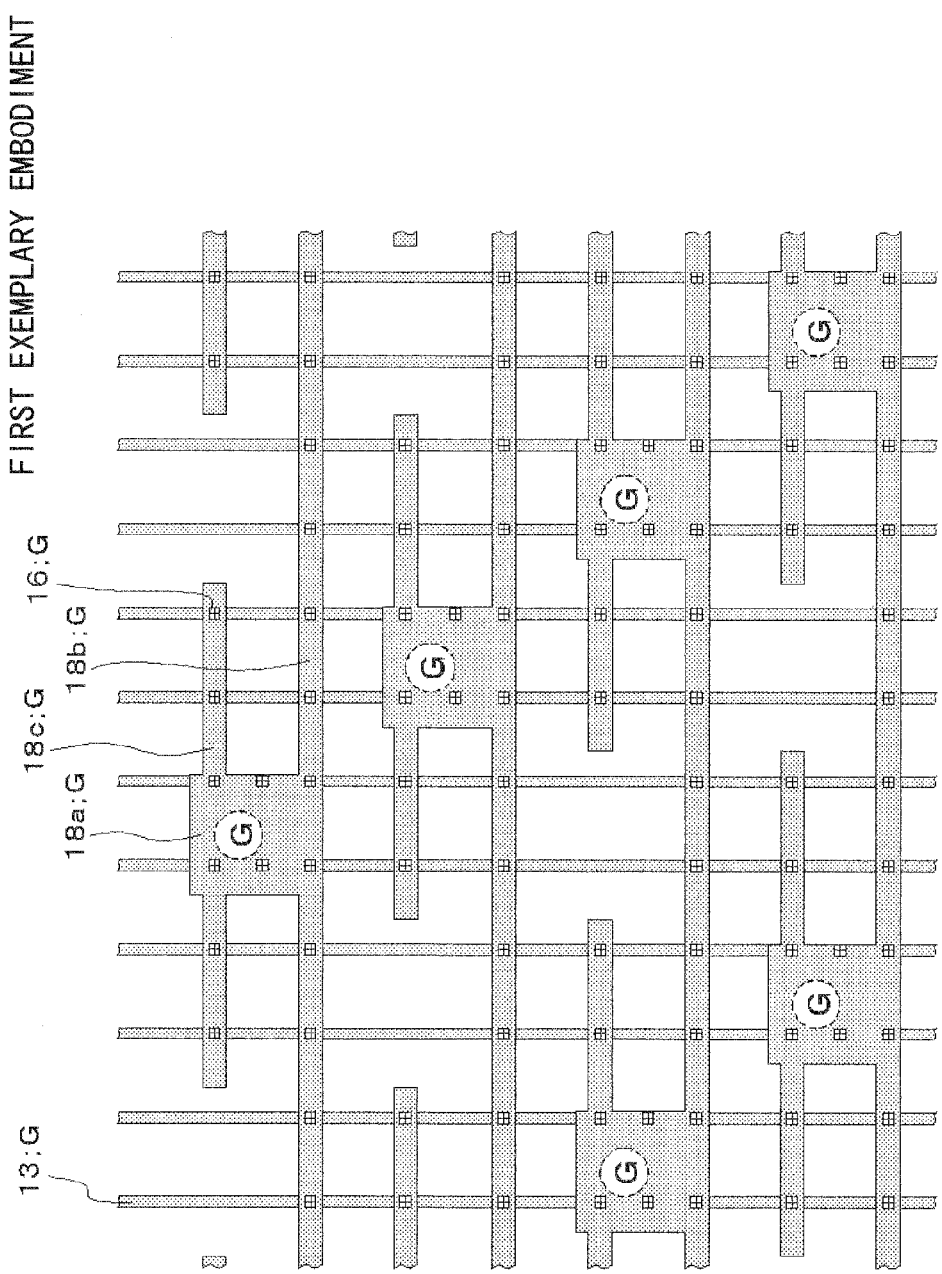
FIG. 5 is a partial plan view schematically showing only the grounding wiring constitution of the semiconductor device according to the first exemplary embodiment of the present invention.

A semiconductor device of a first exemplary embodiment of the present invention is now described with reference to the drawings. FIG. 1 is a partial cross-sectional view schematically showing the constitution of a semiconductor package having mounted thereon a semiconductor device according to the first exemplary embodiment of the present invention. FIG. 2 is a partial plan view schematically showing the wiring constitution of the semiconductor device according to the first exemplary embodiment of the present invention. FIG. 3 is a partial cross-sectional view schematically showing the wiring constitution of the semiconductor device according to the first exemplary embodiment of the present invention. FIG. 4 is a partial plan view schematically showing only the power supply wiring constitution of the semiconductor device according to the first exemplary embodiment of the present invention. FIG. 5 is a schematic plan view showing only the grounding wiring constitution of the semiconductor device according to the first exemplary embodiment of the present invention.

Referring to FIG. 1, a semiconductor device 1 is a semiconductor chip carrying a pad on a chip surface. A large number of protuberantly formed electrodes (bumps) 2 are formed on the pad. The semiconductor device 1 is oriented so that its surface carrying the protuberantly formed electrodes 2 are directed downwards. The protuberantly formed electrodes 2 are directly connected to a land wiring provided on a wiring board 3. A semiconductor package 5, obtained on mounting the semiconductor device 1 on the printed wiring board 3 in accordance with the flipchip system, is mounted via bumps 4 on a printed wiring board, not shown. The bumps 4 are electrically connected to mating protuberantly formed electrodes 2 via wiring, not shown, provided within the bulk of the wiring board 3.

Referring to FIGS. 2 to 5, depicting the semiconductor device 1, an insulating layer 11, operating as an interlayer insulating film, is provided on a unit cell, not shown. On the insulating layer 11 are formed a lower layer power supply wire 12 and a lower layer grounding wire 13, marking up a lower wiring layer. An insulating layer 14 is provided over the insulating layer 11 so as to also cover the lower layer power supply wire 12 and the lower layer grounding wire 13, both of which are formed on top of the insulating layer 11. In prepared holes (via holes) in the insulating layer 14 are arranged power supply vias 15 and grounding vias 16. On the insulating layer 14, provided with the power supply vias 15 and the grounding vias 16, there are provided power supply pads 17a, first upper layer power supply wires 17b, second upper layer power supply wires 17c, grounding pads 18a, first upper layer grounding wires 18b and second upper layer grounding wires 18c, all of which go to make up a pad layer (or pad layer-phase). An insulating layer 19 is provided on the insulating layer 14, carrying thereon (and covering) the first upper layer power supply wires 17b, second upper layer power supply wires 17c, grounding pads 18a, first upper layer grounding wires 18b and the second upper layer grounding wires 18c. In the insulating layer 19 are bored a prepared hole 19a for electrically interconnecting the power supply pad 17a and the bump (4 of FIG. 1), and a prepared hole 19b for electrically interconnecting the grounding pad 18a and the bump (4 of FIG. 1). The pad layers 17a, 17b, 17c, 18a, 18b and 18c are thicker in thickness and hence higher in the power supplying capability than the lower layer power supply wires 12, 13.

The power supply pads 17a are formed in the same layer as the grounding pads 18a and are arranged in alternation with the grounding pads 18a in one direction (for example, direction X in FIG. 2). The power supply pads 17a are shifted to a right side by one column each time the power supply pads 17a are shifted to the lower side in FIG. 2. The first upper layer power supply wires 17b are formed in the same layer as the power supply pads 17a and are extended in one direction (direction X in FIG. 2). Further, each first upper layer power supply wire 17b is formed so as to be unified (integral) with a first end (an upper end in FIG. 2) of each of the power supply pads 17a extending in one direction (X-direction of FIG. 2). The second upper layer power supply wire 17c is formed in the same layer as the power supply pad 17a and is extended between the first upper layer power supply wire 17b and the first upper layer grounding wire 18b from the power supply pad 17a to reach the vicinity of the neighboring grounding pad 18a. The second upper layer power supply wire 17c is arranged between the first upper layer grounding wire 18b and the second upper layer grounding wires 18c.

The grounding pad 18a is formed in the same layer as the power supply pad 17a and is arranged in alternation with the power supply pads 17a in one direction (X-direction in FIG. 1). The grounding pads 18a are shifted to a right side by one column each time the grounding pad 18a is shifted to the lower side in FIG. 2. The first upper layer grounding wire 18b is formed in the same layer as the grounding pad 18a and is extended in one direction (direction X in FIG. 2). Further, the first upper layer grounding wire 18b is formed integral with a second end (a lower end in FIG. 2) of each grounding pad 18a that extends in one direction (X-direction of FIG. 2). The second end is on the opposite side of the first end. The second upper layer grounding wire 18c is formed in the same layer as the grounding pad 18a and is extended between the first upper layer power supply wire 17b and the first upper layer grounding wire 18b from the power supply pad 18a, to reach the vicinity of the neighboring power supply pad 17a. The second upper layer grounding wire 18c is arranged between the first upper layer power supply wire 17b and the second upper layer power supply wire 17c.

Meanwhile, if a plural number of the second upper layer power supply wires 17c and a plural number of the second upper layer grounding wires 18c are extended from facing sides of facing pads, these wires 17c and 18c are preferably interdigitated with one another.

The lower layer power supply wire 12 is provided below the power supply pad 17a, first upper layer power supply wire 17b and the second upper layer power supply wire 17c, with the interposition of the insulating layer 14. The lower layer power supply wire 12 is also electrically connected, by way of power supply vias 15, to one or more or all of the power supply pad(s) 17a, first upper layer power supply wire(s) 17b and the second upper layer power supply wire(s) 17c, and is extended in a direction substantially orthogonal to the first upper layer power supply wire 17b and the second upper layer power supply wire 17c (for example, direction Y in FIG. 2). The lower layer power supply wire 12 is electrically connected, via the power supply vias 15, to the power supply pad 17a of the n'th row (first row of FIG. 2), to the first upper layer power supply wire 17b and the second upper layer power supply wire 17c of the (n+1)st row (second row of FIG. 2), the first upper layer power supply wire 17b of the (n+2)nd row (third row of FIG. 2), and to the first upper layer power supply wire 17b and the second upper layer power supply wire 17c of the (n+3)rd row (fourth row of FIG. 2). The lower layer power supply wire 12 is electrically connected to a unit cell, not shown.

The lower layer grounding wire 13 is provided below the grounding pad 18a, first upper layer grounding wire(s) 18b and the second upper layer grounding wire(s) 18c, via the insulating layer 14. The lower layer grounding wire 13 is also electrically connected, via the grounding vias 16, to one or more or all of the grounding pads 18a, first upper layer grounding wire 18b and the second upper layer grounding wire 18c, and is extended in a direction substantially orthogonal to the first upper layer grounding wire 18b and the second upper layer grounding wire 18c. The lower layer grounding wire 13 is electrically connected, via the grounding vias 16, to the grounding pad 18a of the n'th row (first row of FIG. 2), the first upper layer grounding wire 18b and the second upper layer grounding wire 18c of the (n+1)st row (second row of FIG. 2), the grounding pad 18a of the (n+2)nd row (third row of FIG. 2), and to the first upper layer grounding wire 18b and the second upper layer grounding wire 18c of the (n+3)rd row (fourth row of FIG. 2). The lower layer grounding wire 13 is electrically connected to a unit cell, not shown.

The first exemplary embodiment provides an intricate constitution of the interdigitated upper layer power supply wires 17b, 17c and the upper layer grounding wires 18b, 18c, allowing for distributed disposition of the vias 15, 16 without increasing the number of the vias. This yields relatively impartial delivery and uniform distribution of the supply power from the pad layers 17a, 17b, 17c, 18a, 18b and 18c. Due to distributed disposition of the vias 15 and 16, supply power loads on the lower wiring layers 12, 13 may be decreased. Hence, the thickness and/or the width of the lower wiring layers 12, 13 may be reduced, leading to ease in securing wiring resources, in particular the space for signal wires. Due to the optimum power supply (layout) constitution with impartial supply power distribution, the power may be supplied in the longitudinal and horizontal directions by solely the pad layer 17a, 17b, 17c, 18a, 18b and 18c. Hence, the number of wiring layers and the chip size (planar size of the chip) may be decreased, while the wiring resources are secured.

Figure 10:
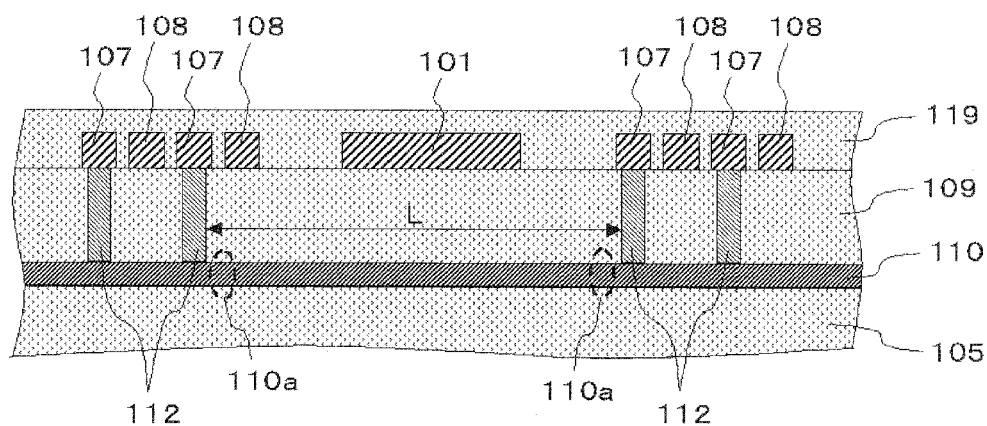
FIG. 10 is a partial cross-sectional view, taken along line B-B' of FIG. 9, and schematically showing the wiring constitution of the semiconductor device of an example of the related art.

Moreover, due to the distributed array of the vias 15, 16, as supply power delivery points to the lower wiring layers 12, 13 from the pad layers 17a, 17b, 17c, 18a, 18b and 18c, having high power supply capability, the current flowing from the vias 15, 16 is equalized, resulting in a reduced supply power load for the lower wiring layers 12, 13 through which flows the current from the vias 15, 16. This results because the broad area inclusive of the width of the pad present between the vias 15 and 16, indicated at L in FIG. 3, may be smaller by one wiring width than the similar area of the related art device (see FIG. 10).

Although the first exemplary embodiment shows a case relating to the combination of the power supply VDD and the ground GND, it is also possible to use the combination of two different (i.e., first and second) potentials.

Second Exemplary Embodiment

Figure 6:
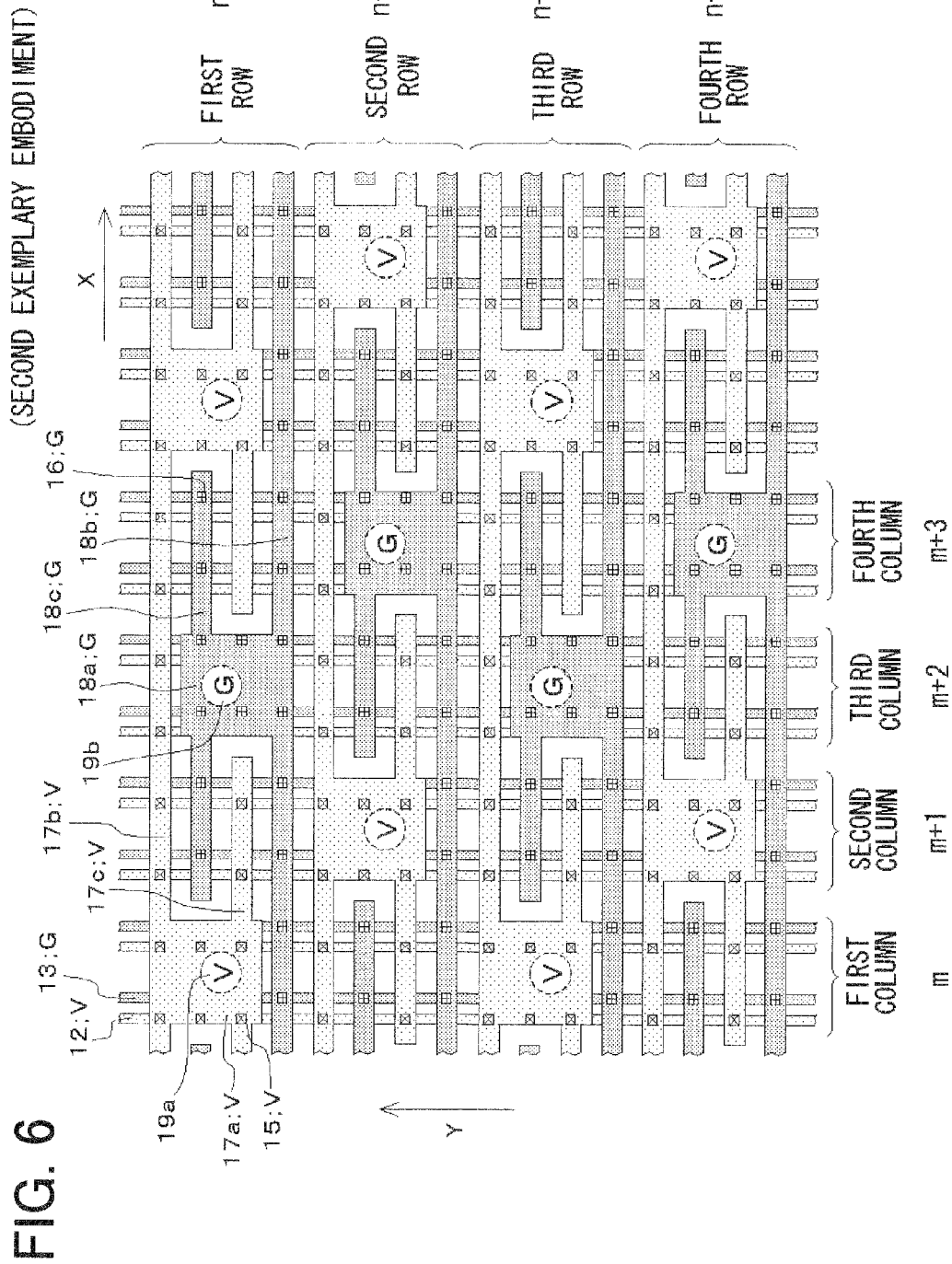
FIG. 6 is a partial plan view schematically showing the wiring constitution of a semiconductor device according to a second exemplary embodiment of the present invention.

A second exemplary embodiment of the present invention is now described with reference to the drawings. FIG. 6 depicts a schematic plan view showing a wiring constitution of a semiconductor device of the second exemplary embodiment of the present invention.

The second exemplary embodiment is similar to the first exemplary embodiment in the row constitution insofar as the constitution of each row with the length equal to a pad-to-pad interval is concerned. However, the arraying pattern of the power supply pads 17 and the grounding pads 18 of the second exemplary embodiment differs from that of the first exemplary embodiment as to the arraying pattern of the power supply pads 17a and the grounding pads 18. In FIG. 6, the power supply pads 17a of even rows are in the same, the power supply pads 17a of odd rows are in the same column, and the power supply pads 17a of even rows are offset, each by one column, to the right of the columns of the power supply pads 17a of the odd rows. The grounding pads 17a of even rows are in the same columns, the power supply pads 17a of odd rows are in the same column, and the power supply pads 17a of even rows are offset, each by one column, to the right of the columns of the power supply pads 17a of the odd rows.

In an m'th column (first column of FIG. 6), the lower layer power supply wire 12 is electrically connected, via power supply vias 15, to the power supply pad 17a of an n'th row (first row of FIG. 6) and to the first upper layer power supply wire 17b and the second upper layer power supply wire 17c of the (n+1)st row (second row of FIG. 6). In an (m+1)st column (second column of FIG. 6), the lower layer power supply wire 12 is electrically connected, via power supply vias 15, to the power supply pad 17a of an (n+1)st row (second row of FIG. 6) and to the first upper layer power supply wire 17b and the second upper layer power supply wire 17c of the (n+2)nd row (third row of FIG. 6). In an (m+2)nd column (third column of FIG. 6), the lower layer power supply wire 12 is electrically connected, via power supply vias 15, to the first upper layer power supply wire 17b of an n'th row (first row of FIG. 6) and to the first upper layer power supply wire 17b and the second upper layer power supply wire 17c of the (n+1)st row (second row of FIG. 6). In an (m+3)rd column (fourth column of FIG. 6), the lower layer power supply wire 12 is electrically connected, via power supply vias 15, to the first upper layer power supply wire 17b of an (n+1)st row (second row of FIG. 6) and to the first upper layer power supply wire 17b and the second upper layer power supply wire 17c of the (n+2)nd row (third row of FIG. 6).

In an m'th column (first column of FIG. 6), the lower layer grounding wire 13 is electrically connected, via grounding vias 16, to the first upper layer grounding wire 18b of an n'th row (first row of FIG. 6) and to the first upper layer grounding wire 18b and the second upper layer grounding wire 18c of the (n+1)st row (second row of FIG. 6). In an (m+1)st column (second column of FIG. 6), the lower layer grounding wire 13 is electrically connected, via grounding vias 16, to the first upper layer grounding wire 18b of an (n+1)st row (second row of FIG. 6) and to the first upper layer grounding wire 18b and the second upper layer grounding wire 18c of the (n+2)nd row (third row of FIG. 6). In an (m+2)nd column (third column of FIG. 6), the lower layer grounding wire 13 is electrically connected, via grounding vias 16, to the grounding pad 18a of an n'th row (first row of FIG. 6) and to the first upper layer grounding wire 18b and the second upper layer grounding wire 18c of the (n+1)st row (second row of FIG. 6). In an (m+3)rd column (fourth column of FIG. 6), the lower layer grounding wire 13 is electrically connected, via grounding vias 16, to the grounding pad 18a of an (n+1)st row (second row of FIG. 6) and to the first upper layer grounding wire 18b and the second upper layer grounding wire 18c of the (n+2)nd row (third row of FIG. 6). Note that in the above disclosure, only typical connections are enumerated, and the remainder will be selfexplanatory.

The present exemplary embodiment is otherwise the same in constitution as the first embodiment.

The present second exemplary embodiment gives results comparable to those of the first exemplary embodiment described above.

Figure 7:
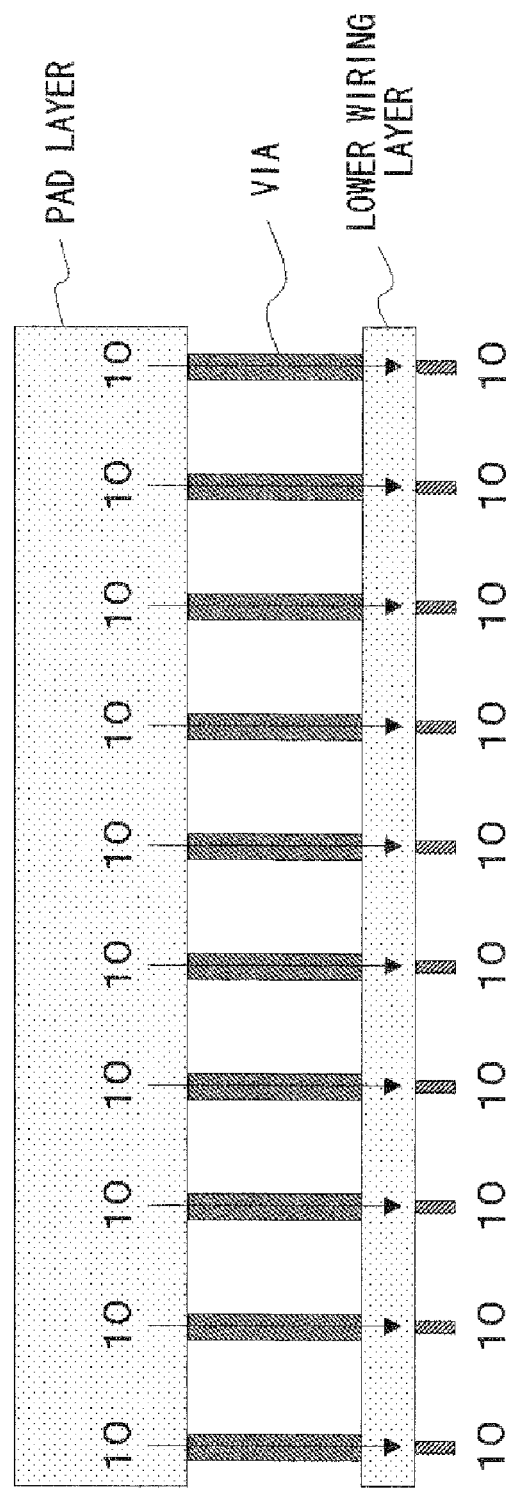
FIG. 7 is a schematic view showing current distribution of a wiring constitution retained to be an ideal wiring constitution.
Figure 8:
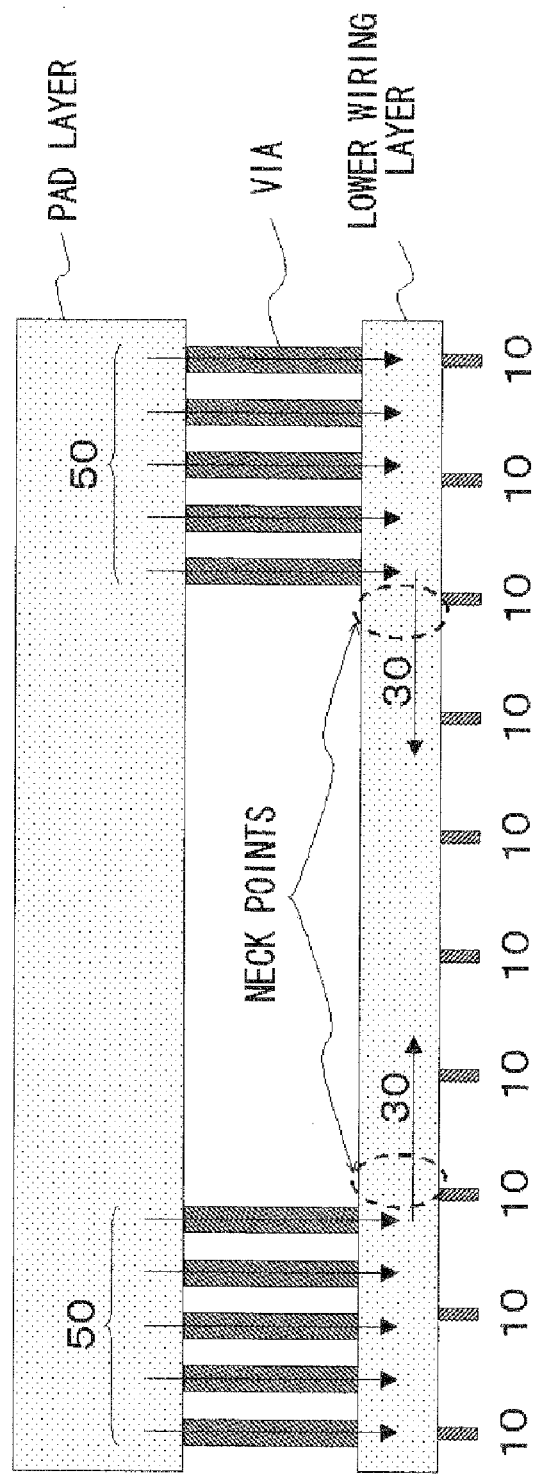
FIG. 8 is a schematic view showing a wiring constitution of a semiconductor device of an example of the related art.
Figure 9:
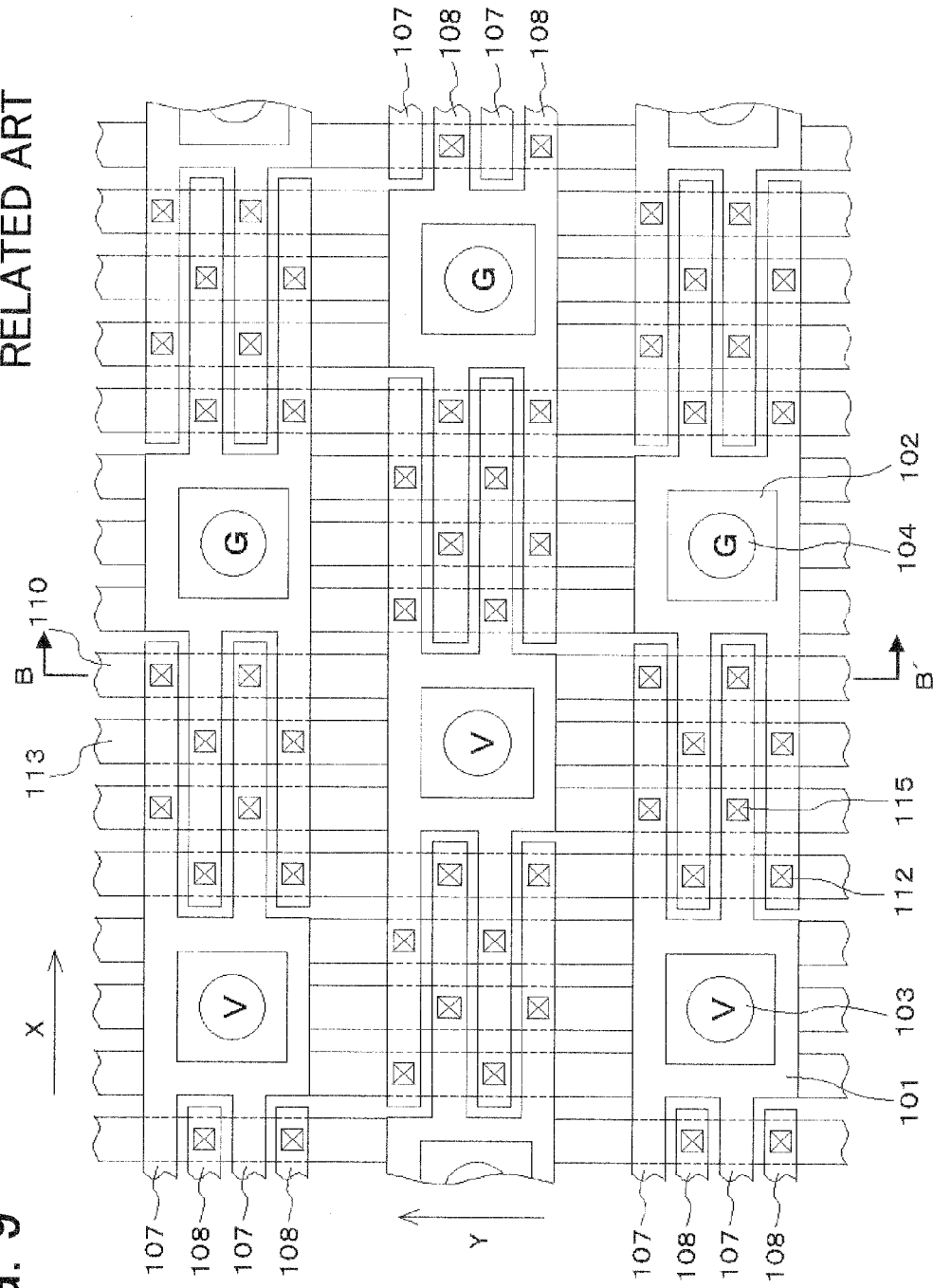
FIG. 9 is a partial plan view schematically showing the wiring constitution of the semiconductor device of an example of the related art.

The concept of reducing the supply power load in the lower layer power supply wiring based on the distributed vias array is now described with reference to the drawings. FIG. 7 depicts current distribution in the wiring constitution retained to be ideal. FIG. 8 depicts current distribution of a wiring constitution of a related art example.

(Ideal Wiring Constitution)

In a wiring constitution, retained to be an ideal wiring constitution, it is assumed that 10 currents (current units) for current consumption are needed from evenly distributed ten sites, in order to assist in understanding the effect of localized vias disposition. In the pad layer, ten currents flow through each via, provided that the wiring resistance is sufficiently low and the ten vias are evenly distributed on the entire chip surface (see arrow of FIG. 7). There is substantially no current flowing in the horizontal direction of the lower wiring layer. Hence, in the basic power supply constitution, a substantially zero current may be caused to flow through out (transverse) the lower wiring layer. It is noted that, although the wiring constitution of FIG. 7 is ideal insofar as supply power delivery is concerned, it can actually not be used for fear of suppressing (adversely affecting) the signal wiring.

RELATED ART, COMPARATIVE EXAMPLE

In a wiring constitution of a related art example, it is assumed that 10 currents (current units) for current consumption are needed from evenly distributed ten sites, in order to assist in understanding the effect of localized vias disposition. In case the pad layer is sufficiently low in the wiring resistance, and the ten vias are arranged in a congested state localized in two sites, at a rate of five vias in each site, 50 currents flow through each site, as indicated by arrows in FIG. 8. From this via position relationship, the maximum value of the current flowing in the region of the lower wiring layer between neck points is assumed 30. Thus, as the matter of the basic power supply constitution, it is necessary for the lower wiring layer to be of a thickness and a width sufficient to allow 30 currents to flow therein. For example, in case the lower wiring layer is of a preset width, the thickness of the lower wiring layer of the wiring constitution of the related art example shown in FIG. 8 has to be thicker than that of the lower wiring layer of the ideal wire constitution shown in FIG. 7.

The wiring constitution of the present invention represents an improvement over the wiring constitution of the related art in that it approaches the ideal constitution as compared to the wiring constitution of the related art. That is, the present wiring constitution diminishes the load of the supply power as the space for signal wiring is maintained.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
    a plurality of pads and a plurality of protuberantly formed electrodes arrayed in regular order on a surface of each pad, said semiconductor device being mounted on a wiring board in accordance with a flipchip system; wherein said semiconductor device comprises:
    a plurality of first potential pads to which a first potential is applied;
    a plurality of second potential pads to which a second potential different from the first potential is applied; the second potential pads being formed in the same layer as the first potential pads and arrayed in one direction in alternation with the first potential pads;
    a first potential upper layer common wire formed in the same layer as the first potential pads; said first potential upper layer common wire extending in said one direction and being connected to a first end of each of the first potential pads viewed in said one direction;
    a second potential upper layer common wire formed in the same layer as the second potential pads; said second potential upper layer common wire extending in said one direction and being connected to a second end of the second potential pad said second end being on an opposite side to said first end viewed in said one direction;
    a first potential upper layer branched wire formed in the same layer as the first potential pad and extending between said first potential upper layer common wire and said second potential upper layer common wire, from the first potential pad to the vicinity of the second potential pad neighboring the first potential pad; and
    a second potential upper layer branched wire formed in the same layer as the second potential pad and extending between said first potential upper layer common wire and said second potential upper layer common wire, from the second potential pad to the vicinity of the first potential pad neighboring to the second potential pad.

2. The semiconductor device according to claim 1, wherein said first potential upper layer branched wire is arranged between said second potential upper layer common wire and said second potential upper layer branched wire; and wherein said second potential upper layer branched wire is arranged between said first potential upper layer common wire and said first potential upper layer branched wire.

3. The semiconductor device according to claim 1, wherein said first potential upper layer branched wire and said second potential upper layer branched wire are branched into a plurality of wires from one side of one of said pads; and wherein said first potential upper layer branched wires and said second potential upper layer branched wires are inter-digitated.

4. The semiconductor device according to claim 1, further comprising:
    a first potential lower layer wire formed in a layer below the first potential pad, said first potential upper layer common wire and said first potential upper layer branched wire; said first potential lower layer wire being connected by way of vias to one or more or all of the first potential pad, said first potential upper layer common wire and said first potential upper layer branched wire; said first potential lower layer wire extending in a direction substantially orthogonal to said first potential upper layer common wire and said first potential upper layer branched wire; and
    a second potential lower layer wire formed in a layer below the second potential pad, said second potential upper layer common wire and said second potential upper layer branched wire; said second potential lower layer wire being connected by way of vias to one or more or all of the second potential pad, said second potential upper layer common wire and said second potential upper layer branched wire; said second potential lower layer wire extending in a direction substantially orthogonal to said second potential upper layer common wire and said second potential upper layer branched wire.

5. The semiconductor device according to claim 4, wherein said first potential lower layer wire is connected by way of vias to the first potential pad of an n'th row, to said first potential upper layer common wire and said first potential upper layer branched wire of an (n+1)st row, to said first potential upper layer common wire of an (n+2)nd row and to said first potential upper layer common wire and said first potential upper layer branched wire of an (n+3)rd row; and wherein said second potential lower layer wire is connected by way of vias to said second potential upper layer common wire of an n'th row, to said second potential upper layer common wire and said second potential upper layer branched wire of an (n+1)st row, to the second potential pad of an (n+2)nd row and to said second potential upper layer common wire and said second potential upper layer branched wire of an (n+3)rd row.

6. The semiconductor device according to claim 4, wherein said first potential lower layer wire is connected, in an m'th column, by way of vias, to the first potential pad of an n'th row and to said first potential upper layer common wire and said first potential upper layer branched wire of said (n+1)st row; and wherein said second potential lower layer wire is connected, in said m'th column, by way of vias, to said second potential upper layer common wire of an n'th row and to said second potential upper layer common wire and said second potential upper layer branched wire of said (n+1)st row.

7. The semiconductor device according to claim 6, wherein said first potential lower layer wire is connected, in said (m+2)nd column, by way of vias, to said first potential upper layer common wire of said n'th row and to said first potential upper layer common wire and said first potential upper layer branched wire of said (n+1)st row; and wherein said second potential lower layer wire is connected, in said (m+2)nd column, by way of vias, to said second potential pad of said n'th row and to said second potential upper layer common wire and said second potential upper layer branched wire of said (n+1)st row.

8. The semiconductor device according to claim 1, wherein said first potential comprises a power supply potential; and wherein said second potential comprises a grounding potential.

9. A semiconductor package comprising;
a wire board; and
a semiconductor device according to claim 1, mounted via electrodes on said wire board in accordance with a flip-chip system.

* * * * *